United States Patent [19]

Heep

[11] Patent Number: 5,142,398
[45] Date of Patent: Aug. 25, 1992

[54] TIMER SYSTEM FOR LEARNING AND REPLAYING OF INFRARED SIGNALS

[75] Inventor: Jerry J. Heep, Weatherford, Tex.

[73] Assignee: Tandy Corporation, Ft. Worth, Tex.

[21] Appl. No.: 377,966

[22] Filed: Jul. 11, 1989

[51] Int. Cl.[5] ............................................. H04B 10/10
[52] U.S. Cl. .................................... 359/148; 341/176; 358/194.1
[58] Field of Search ...................... 358/194.1; 341/176; 455/603, 608, 617, 618; 359/148

[56] References Cited

U.S. PATENT DOCUMENTS

| | | | |
|---|---|---|---|
| 4,623,887 | 11/1986 | Welles, II | 340/825.72 |
| 4,703,359 | 10/1987 | Rumbolt | 455/603 |
| 4,802,114 | 1/1989 | Sogame | 340/825.72 |
| 4,825,200 | 4/1989 | Evans | 455/603 |
| 4,837,627 | 6/1989 | Mengel | 158/194.1 |
| 4,857,898 | 8/1989 | Smith | 341/176 |
| 4,905,279 | 2/1990 | Nishio | 158/194.1 |

FOREIGN PATENT DOCUMENTS 2226905A 7/1990 United Kingdom .

Primary Examiner—Edward L. Coles, Sr.
Assistant Examiner—L. Pascal
Attorney, Agent, or Firm—Townsend and Townsend

[57] ABSTRACT

A remote controller capable of learning and later transmitting infrared signals transmitted by any other remote controller. The remote controller determines which of four modes of transmission a signal is transmitted in, including carrier mode, pulse mode, frequency shift keying mode and continuous wave mode. Once the type of signal is determined the controller learns each signal, saves them and later replays them to control a remote device.

22 Claims, 7 Drawing Sheets

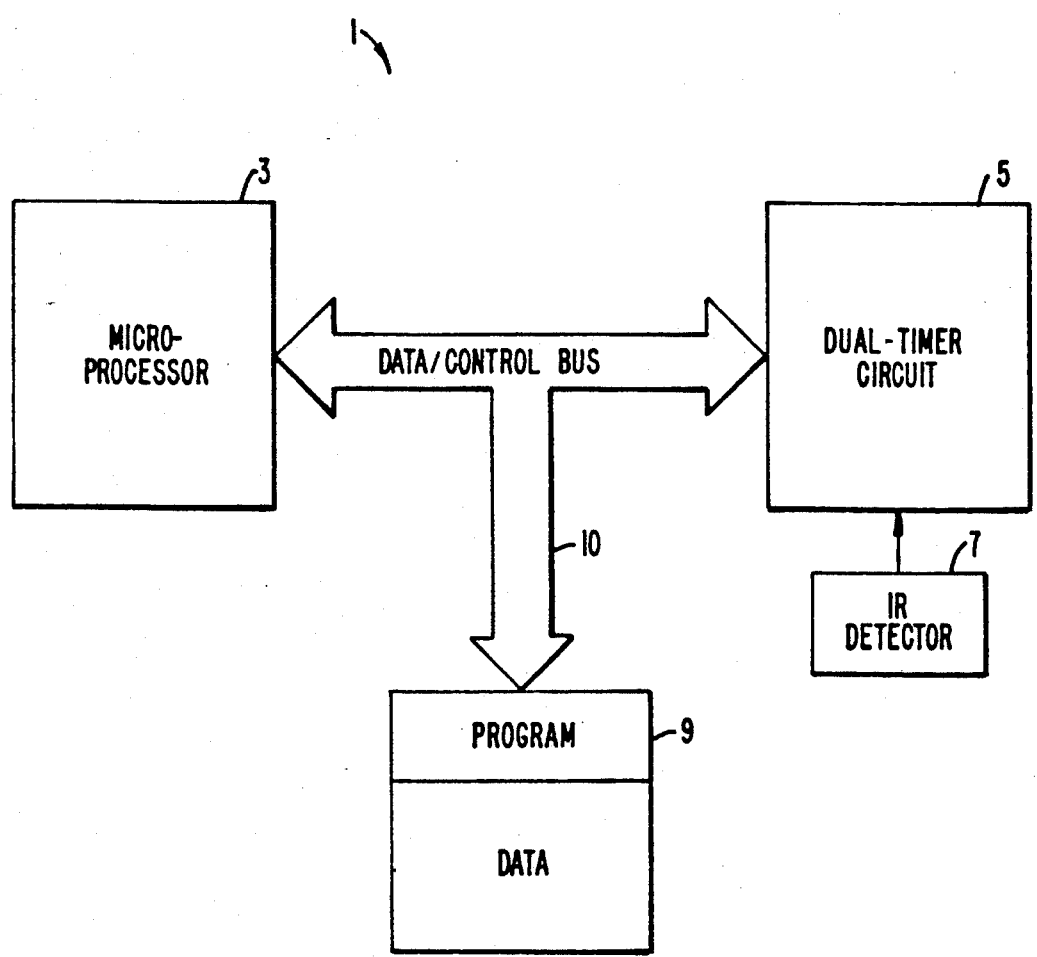
FIG._1.

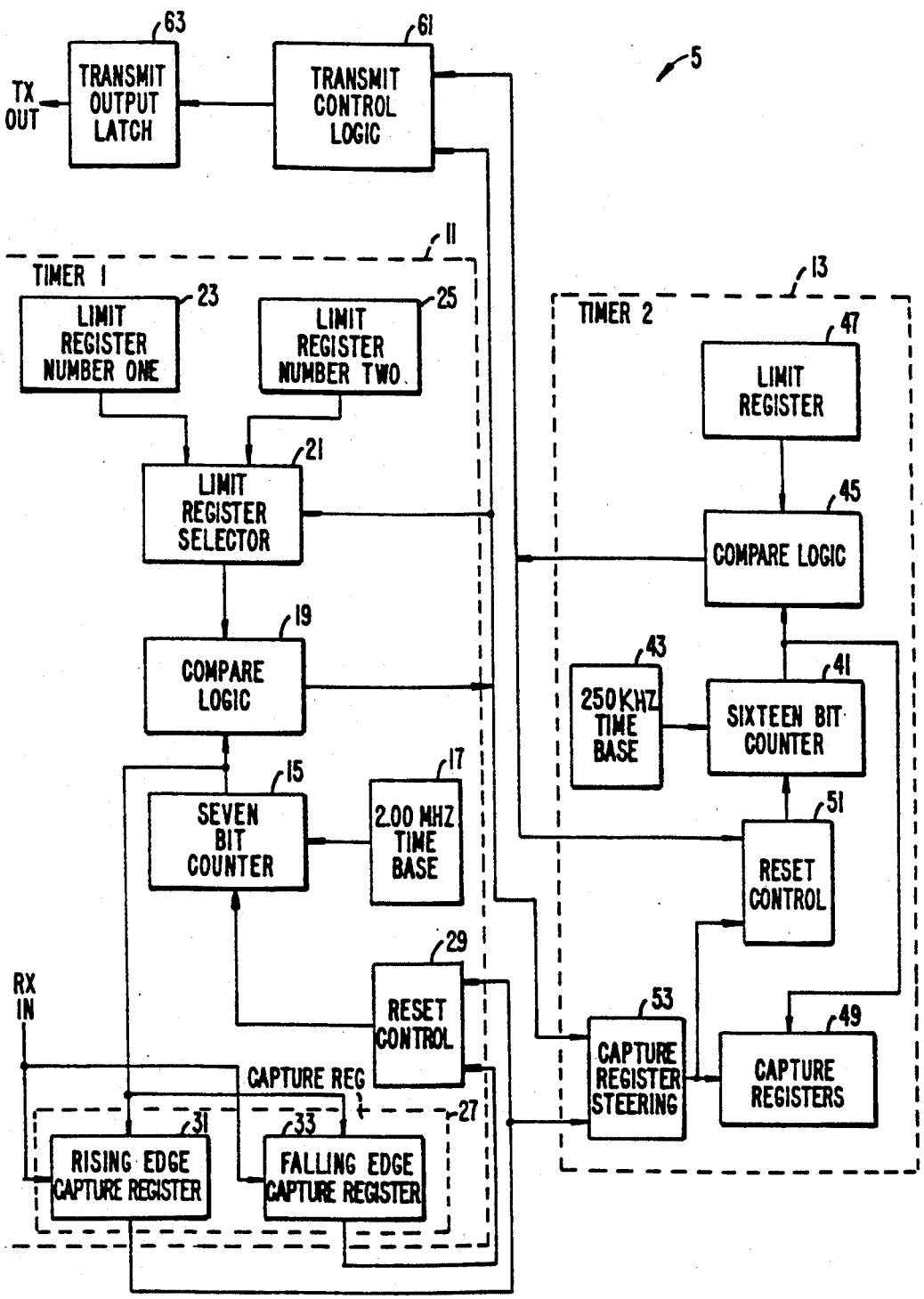
FIG._2.

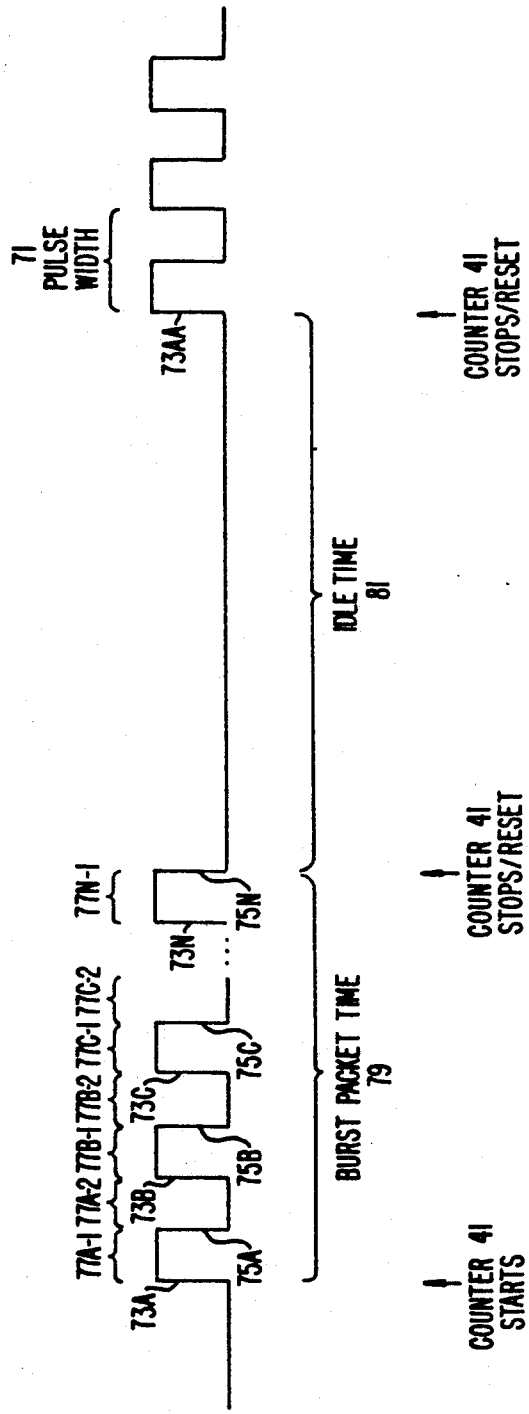
FIG._3A.
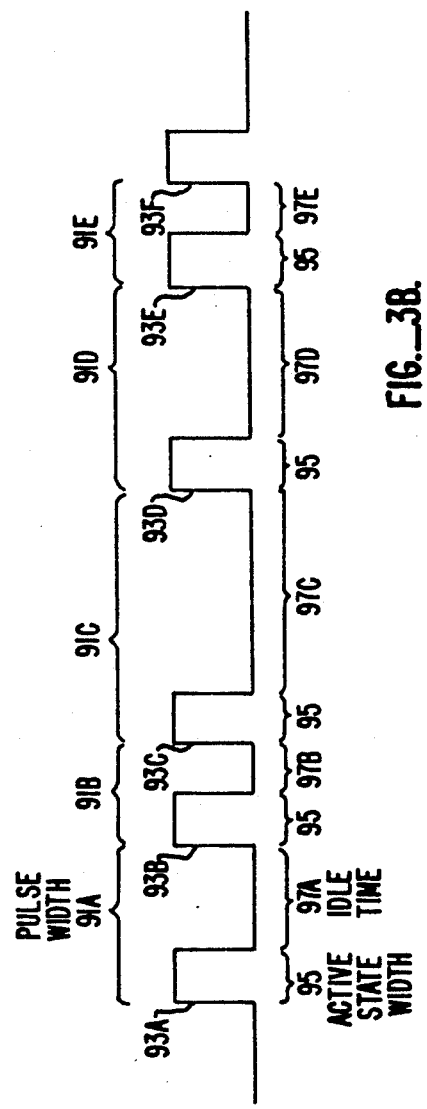
FIG._3B.

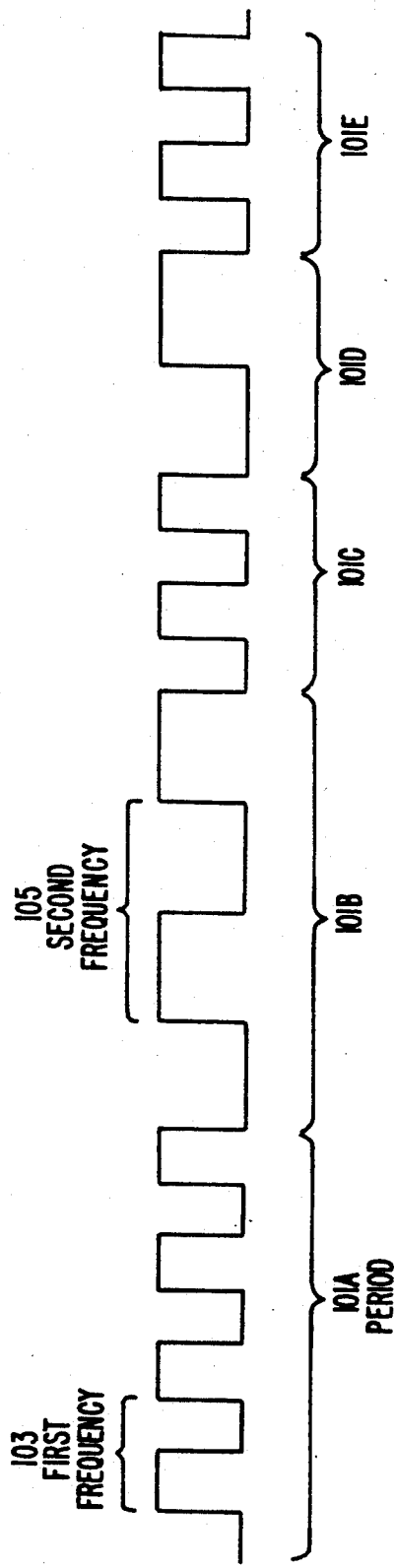
FIG._3C.
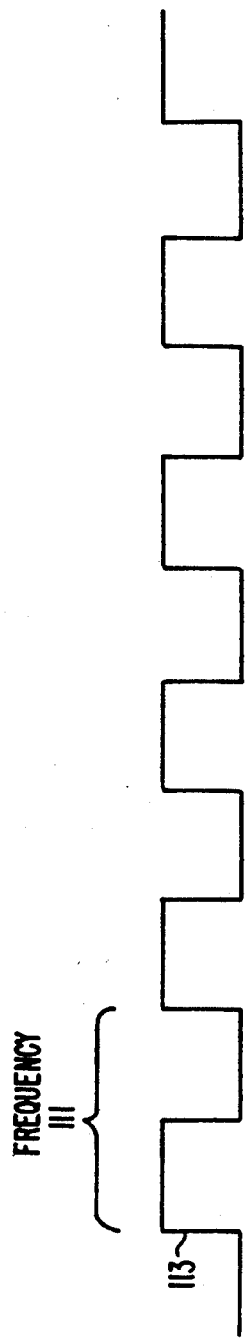
FIG._3D.

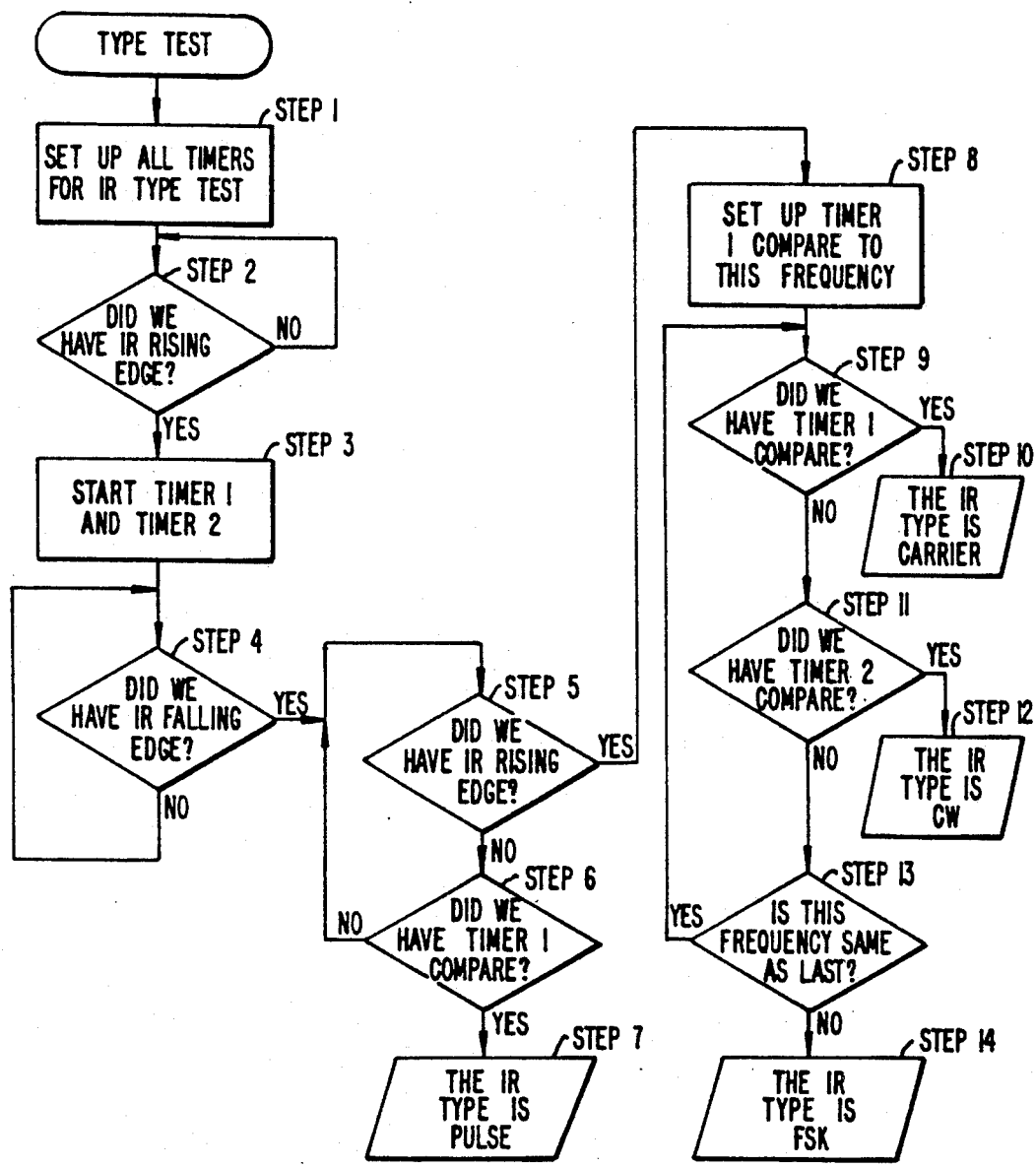
FIG._4.

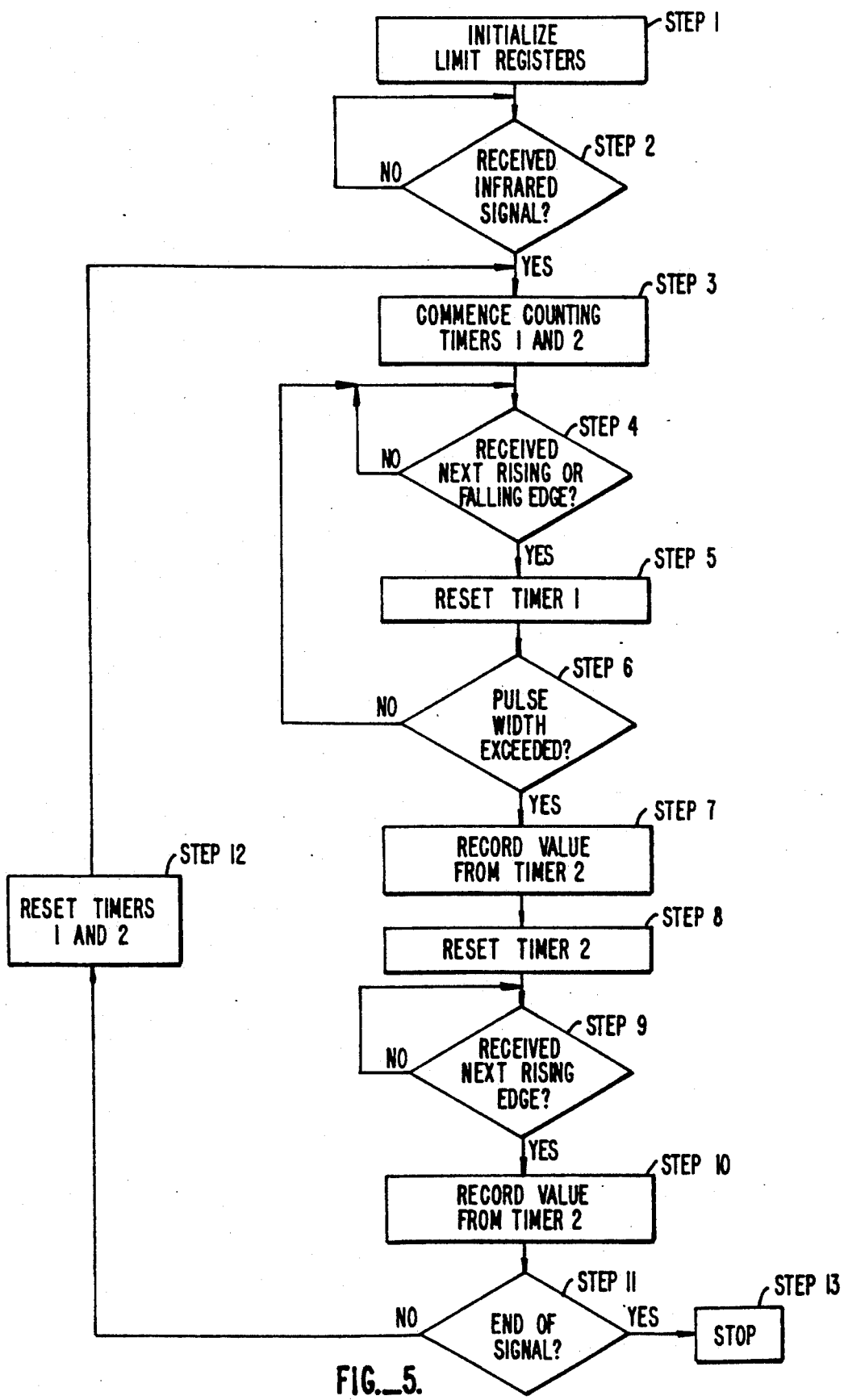
FIG._5.

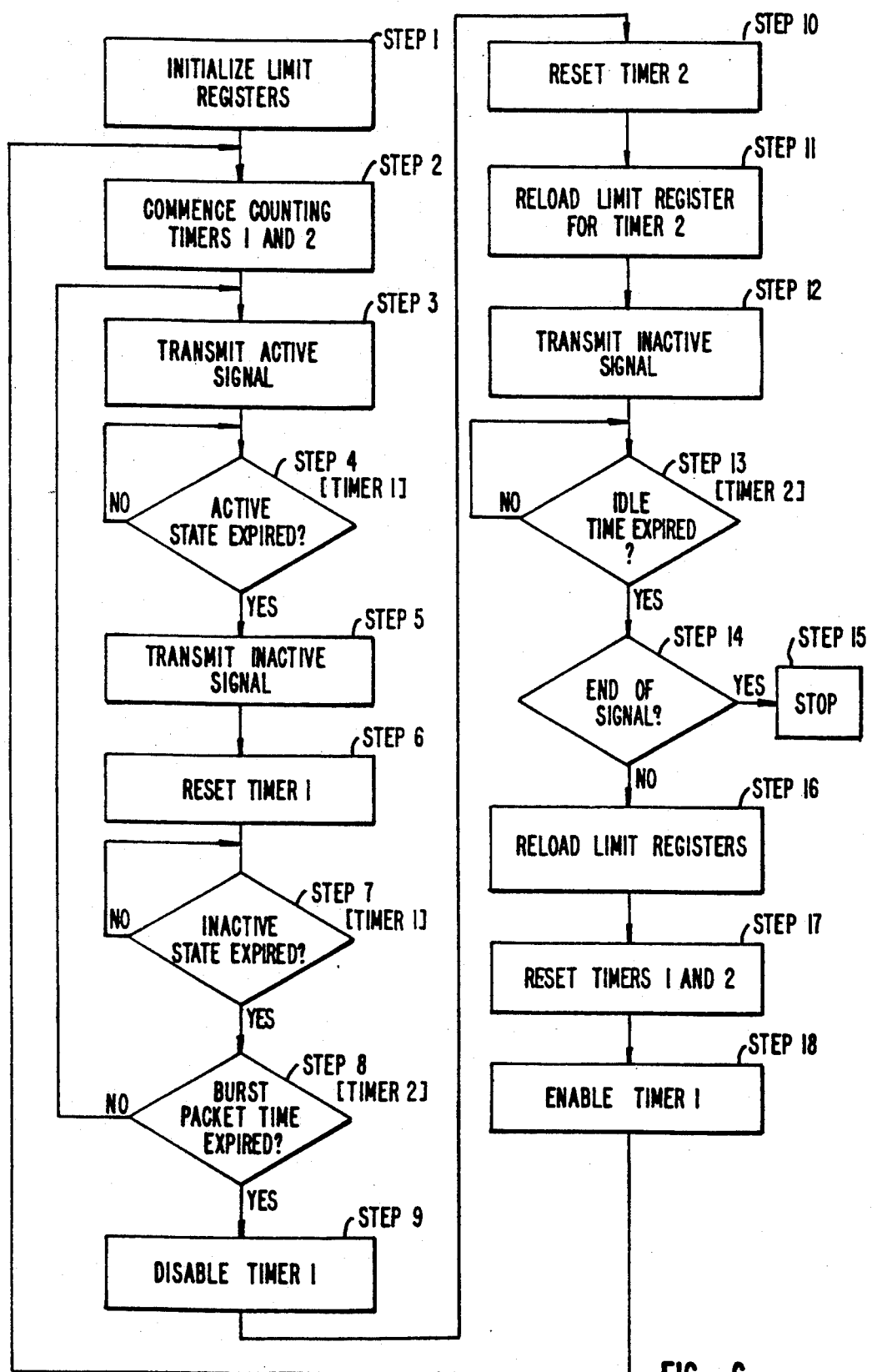
FIG._6.

TIMER SYSTEM FOR LEARNING AND REPLAYING OF INFRARED SIGNALS

BACKGROUND OF THE INVENTION

The present invention relates generally to learning and replaying of infrared signals in a system with a remote controller and a controlled device. More particularly, the invention is directed to learning the signals of any standard, preset remote controller or controllers and replaying them to control the remote device or devices.

Remote controlled devices have become quite popular in recent years. A typical consumer may purchase a wide assortment of remote controlled devices including, but not limited to, televisions, video cassette recorders, and stereo systems. Each of these devices comes with its own, separate remote control. The consumer must keep a multiplicity of controllers readily at hand in order to enjoy the use of the purchased devices. As the number of remote controlled devices increases, the number of remote controllers becomes more and more of a nuisance.

Presently, universal remote controllers are available. These controllers will learn and later replay infrared patterns to control a group of remote devices. A problem that exists in the available universal remote controllers is that the timer hardware systems, built into the existing microprocessors used in these universal remote controllers, are too limited to perform universal remote control functions.

SUMMARY OF THE INVENTION

The present invention provides a single remote controller capable of learning and replaying the infrared signals of any other controller. This invention may be substituted for a multiplicity of controllers allowing a person to use each of the remote controlled devices with a single remote controller.

Another object of the invention is to provide a single remote controller which can learn and replay infrared signals encoded in any of four transmission modes including carrier mode, pulse mode, frequency shift keying mode, or continuous wave mode.

A further object of the invention is to provide a single remote controller which can be reprogrammed upon the purchase of new remote controlled devices. The capability of reprogramming allows the user to continue to use one remote controller even after the purchase of additional remote controlled devices.

Another object of the invention is to provide a custom timer for interacting with a microprocessor unit to control remote devices. The custom timer is designed to overcome the limitations inherent in the timer hardware built into the presently existing universal remote controllers. This custom timer makes the universal remote control functions easier to implement and increases the efficiency of the remote controller.

These features, as well as others, will become more readily apparent from the following detailed description of the preferred embodiment when taken in conjunction with the illustrative embodiment in the accompanying drawings.

BRIEF DESCRIPTION OF THE DRAWINGS

FIG. 1 is a block diagram of the system including the custom timer circuit;

FIG. 2 is a block diagram of the custom timer circuit:

FIGS. 3A, 3B, 3C and 3D are timing diagram illustrating the various encoded infrared signals:

FIG. 4 is a flow chart illustrating how the timer circuit of FIG. 2 determines what mode the carrier signal is being transmitted in:

FIG. 5 is a flow chart illustrating the carrier mode learn function;

FIG. 6 chart illustrating the carrier mode transmit function.

DETAILED DESCRIPTION OF THE PREFERRED EMBODIMENT

FIG. 1 is a functional block diagram of a system 1 which is used to learn, save, and replay infrared patterns. System 1 includes a microprocessor 3 for controlling operations. A dual-timer circuit 5 is used to capture and replay the timing of the signals received from an infrared detector 7. A memory 9 stores the programs to be executed by the microprocessor 3 and data captured by times circuit 5. Finally a data/control line 10 connects microprocessor 3, timer circuit 5 and memory 9.

FIG. 2 is a functional block diagram of the preferred embodiment of dual timer circuit 5 shown in FIG. 1. A first timer 11 operates in conjunction with a second timer 13 to learn and replay infrared signals received from an infrared detector.

First timer 11 includes a counter 15 which is driven by a clock 17. Counter 15 is connected to a compare logic unit 19. Compare logic unit 19 compares the count value of counter 15 to the value output by limit register selector 21. Limit register selector 21 selects between the outputs of limit register one 23 and limit register two 25. Of course, more than two limit registers may be used and in some cases, only one is necessary.

In addition to being connected to compare logic unit 19, counter 15 is connected to capture register unit 27. The outputs of capture register unit 27 are input to a reset control unit 29 which resets counter 15.

Capture register unit 27 includes a rising edge capture register 31 and a falling edge capture register 33. These registers are used to capture the edges of the signal received on the "RX IN" line from the infrared detector (not shown). In addition, these registers capture the time period of the pulse width from counter 15.

First timer 11 interacts with second timer 13. Second timer 13 includes similar components to those of first timer 11. A counter 41 is driven by a clock 43. The output of counter 41 is fed to a compare logic unit 45. Compare logic unit 45 is connected between counter 41 and a limit register 47. Count values from counter 41 and limit register 47 are compared and the output of compare logic unit 45 is dependent upon which value is greater. The output of counter 41 is also input to capture registers 49. A reset control unit 51 is connected to reset counter 41 and compare logic unit 45. Upon receipt of a signal from either compare logic unit 45 or a capture register steering unit 53, reset control unit 51 resets counter 41.

Capture register steering unit 53 transmits signals to capture registers 49 upon receipt of signals from either rising edge capture register 31 or compare logic unit 19.

Finally, a transmit control logic unit 61 receives an input from each of compare logic units 19 and 45. The output is directed to a transmit output latch 63 where it is output from the remote controller.

FIG. 3 is a set of four timing diagrams showing the four different infrared signals. FIG. 3A shows carrier mode. Carrier mode is made up of "burst packets" of pulses contained in burst packet time 79. These burst packets are interspersed with idle times 81. The remote controller transmits varying burst packet time periods 79 and idle time periods 81 which represent a variety of commands.

FIG. 3B shows pulse mode. Pulse mode is made up of pulses of equal active state width 95 interspersed with idle times 97. The varying idle time periods between pulses allow a variety of commands to be represented.

FIG. 3C shows frequency shift keying mode. Frequency shift keying mode is made up of a continuous train of pulses which switch between two different frequencies. For example, period 101A contains a group of pulses having a first frequency 103 while period 101B contains a group of pulses having a second frequency 105. The pattern of frequency changes determines the information that is transmitted to the receiving device.

Finally, FIG. 3D shows continuous wave mode. A continuous wave mode signal is made up of a continuous train of a constant frequency 111. By varying frequency 111, a variety of commands are transmitted.

FIGS. 3A-3D will be more fully explained along with the operation of the various functions of the invention. Those functions include the learn function and the transmission function.

FIGS. 4, 5, and 6 are flow charts which illustrate various functions of the invention. These figures will be more fully explained below as the functions are described.

The learn function involves receiving a set of infrared signals from a preset remote control device and saving them to be replayed later. The transmission function involves recalling the saved infrared signals and replaying them to control a remote device.

The operation of the invention will now be discussed with reference to FIGS. 1, 2, 3, and 4.

INFRARED SIGNAL MODE DETERMINATION

Before the remote controller can learn the various commands of another preset controller, it must determine which of the four modes is being received on the RX IN line. FIG. 4 illustrates how this determination is made. Initially, the remote controller presumes that the incoming infrared signal will be encoded in the carrier mode. This is because carrier mode is the most commonly used mode.

Microprocessor 3 under control of a type determination program stored in memory 9 sets up the timers for determination of the mode of the incoming signals (step 1). Limit register one 23 is loaded with a preselected value equal to the lowest possible carrier mode pulse width 71. First timer 11 then waits for a rising edge (step 2). When a rising edge is received, both counters 15, 41 are started (step 3). A falling edge is eventually received (step 4), at which time a rising edge is anticipated (step 5). If first counter 15 is not reset fast enough by a second rising edge (step 5), then it is determined whether or not a compare took place in first timer 11 (step 6). If a compare occurred (step 6), then the signal is a pulse mode signal (step 7). Otherwise, the system waits for the next rising edge (step 5). Pulse mode is known and selected the case that a compare occurs because the time between pulse mode pulses is greater than the value in limit register one 23.

If a rising edge does occur fast enough (step 5), counter 15 is reset and first timer 11 is set up to compare frequency (step 8). If a compare occurs (step 9) and the count of first counter 15 does not exceed the value in limit register one 23, then it is known the incoming signal is carrier mode (step 10). Otherwise, the signal is continuous wave or frequency shift key mode.

In deciding between continuous wave and frequency shift key modes, second counter 41 is checked for a reset signal. If counter 41 is reset (step 11), the signal is a continuous wave signal (step 12). Otherwise the frequency of the present pulse is checked to see if it is the same as the last pulse (step 13). If it is not the same, the signal is in frequency shift key mode (step 14). If it is the same, the system is sent back to check whether a compare has occurred in first counter 15 (step 9).

LEARN FUNCTION

Once the mode of the signal is determined, the remote controller can actually learn the signal. Of course, this procedure starts as soon as a signal is received. Therefore, the timers 11, 13 must be keeping track of the elapsed periods even before a determination of the mode is made.

Since carrier mode is the most popular mode of transmission, this description will be limited to carrier mode operation. Differences in operation for the other three modes will be pointed out as necessary. Carrier mode learn will be described with reference to FIGS. 1, 2, 3, and 5.

The description of the carrier mode learn function will be made with reference to FIG. 5. Initially, limit register one 23 is loaded with a preselected count value, selected by microprocessor 3, equal to a period of a "false" 0 infrared carrier mode signal frequency (Step 1). It is "false" because it is a carrier mode signal frequency which is not possible. Limit register selector 21 is locked to receive an input from limit register one 23. As an infrared signal is received (Step 2) on the RX IN line, counters 15, 41 begin counting (Step 3). Every time a rising edge 73 or falling edge 75 of the infrared signal is received by rising edge capture register 31 and falling edge capture register 33 respectively (Step 4), a signal is transmitted to reset control unit 29. This signal causes the value in counter 15, which is equal to the width of the pulse 77 of the infrared signal, to be stored in capture register unit 27. The active state width 77A-1 between rising edge 73 and falling edge 75 is captured by rising edge capture register 31 while the inactive state width 77A-2 between falling edge 75 and rising edge 73 is captured by falling edge capture register 33. At the same time, reset control unit 29 resets counter 15 (Step 5). Active state widths 77A-1 and inaction state widths 77A-2 and stored by microprocessor 3 in memory 9.

Each time the count value in counter 15 is increased, compare logic unit 19 compares the new count value to the preselected count value stored in limit register one 23 (Step 6). Providing the count of counter 15 has not exceeded the preselected count value, counters 15, 41 continue to count. If the count value has exceeded the preselected count value a number of simultaneous events are caused to occur. First, compare logic unit 19 issues a signal to capture register steering unit 53. Second, capture register steering unit 53 triggers burst packet time 79, which is equal to the count value from counter 41, to be stored in capture register 49 (Step 7). Burst packet time 79 is also stored by microprocessor 3 in memory 9. Third, capture register steering unit 53 causes reset control unit 51 to reset counter 41 (Step 8). And fourth, capture register steering logic unit 53 is set to receive a capture trigger from rising edge capture register unit 31.

After being reset, counter 41 begins counting again. The value of the count in counter 41 now begins keeping track of the idle time 81 between burst packet times 79 of carrier mode data. This idle time 81 is critical for reproducing the infrared signal. Counter 41 stops counting upon receipt of the next rising edge 73AA. When idle time 81 has expired, next rising edge 73AA (Step 9) of the IR burst will trigger second timer 13 to capture idle time 81 and set capture register steering unit 53 back to monitor compare logic unit 19 of first timer 11. This is accomplished by counter 41 storing its count in capture register 49 upon receiving a reset signal from reset control unit 51. The idle time value is also stored in memory 9 by microprocessor 3 (Step 10). Providing the end of the signal has not been indicated (Step 11). the reset control unit 51 receives the reset signal from capture register steering unit 53 when the next rising edge 73AA from rising edge capture register 31 is received (Step 12). If the end of the signal has been reached, system 1 stops (Step 13).

In pulse mode, rising edge capture data is ignored. The pulse width 91 is measured by the data inside falling edge capture register 33. Capture register steering unit 53 is locked to only sample pulses from rising edge capture register 31. In this manner, rising edges 93 are used to signal the end of the idle times 97 between pulses and to restart counter 41 for the beginning of the next measurement cycle. Limit registers 23 and 25 are not used in the pulse mode.

Frequency shift key mode requires heavy microprocessor interaction. First timer 11 is set up to measure period 101 and not pulse widths. In this mode, the rising edge capture register 31 is used to reset counter 15 while falling edge capture register 33 captures data. The capture of data does not affect the count of counter 15. Second timer 13 is set up to be triggered by the microprocessor, not any first timer 11 source.

Continuous wave mode is the least complex. First timer 11 measures frequency 111 of the infrared signal. Second timer 13 is unused. When the continuous carrier is terminated, compare logic unit 45 will detect that counter 15 has exceeded the value in limit register one 23.

TRANSMISSION FUNCTION

Transmission does not require the use of capture registers 27 and 49. However, limit registers 23, 25, and 47 are essential. As with the description of the learn mode, transmission mode will be described with respect to carrier mode transmission. This description will follow the steps of FIG. 6. Differences for the other three modes will be pointed out as necessary.

In carrier mode, microprocessor 3 sets the limit registers of first timer 11 to hold active state width 77A-1 and inactive state width 77A-2 of burst packet time 79. Limit register one 23 holds active state width 77A-1 while limit register two 25 holds inactive state width 77A-2. Limit register 47 of second timer 13 alternatively holds burst packet time 79 and idle time 81 of the infrared signal (Step 1).

First counter 15 and second counter 41 are signalled by microprocessor 3 to begin counting (Step 2). Transmit output latch unit 63 is set to transmit an active signal. The output of first counter 15 is continually compared to limit register one 23 (Step 4). When the count in first counter 15 exceeds the active state width time 77A-1 held in limit register one 23, transmit output latch 63 is switched to transmit an inactive signal (Step 5).

Once transmit output latch 63 is set to transmit an inactive signal, two events are caused to occur. First, limit register selector 29 is set to output the inactive state width time 77A-2 held in limit register two 25. And second, counter 15 is reset to begin counting again (Step The inactive state continues until first counter 1 exceeds the inactive state width 77A-2 stored in limit register two 25 (Step 7). Compare logic unit 19 compares the count value to the inactive state width 77A-2 after each increment of first counter 15. Then, when compare logic unit 19 detects that the count value has exceeded the inactive state width 77A-2, transmit output latch 63 is again switched to the active state.

Transmit output latch 63 continues to switch back and forth between active and inactive. This switching allows for the transmission of the burst packets of the carrier mode infrared signal. The switching between active and inactive continues until second counter 41 reaches burst packet time 79 held in limit register 47 (Step 8). This burst packet time 79 is detected by compare logic unit 45 which compares burst packet time 79 to the count value of second counter 41 after each time counter 41 is incremented.

Once burst packet time 79 is reached, compare logic unit 45 will issue a signal causing a number of events to occur. First, transmit output latch 63 is disabled and reset to its inactive state. Second, limit compares from first timer 11 are prevented from affecting the output latch, essentially disabling first timer 11 (Step 9). Third, counter 41 is reset to begin counting again (Step 10). And fourth, the microprocessor 3 is signalled that a new time limit needs to be loaded into limit register 47 equal to idle time 81 (Step 11). Once idle time 81 has been loaded into limit register 47, second counter 41 counts until the inactive state (Step 12) has been transmitted for idle time 81 (Step 13).

When idle time 81 has been reached compare logic unit 45 will signal that idle time 81 is complete and another burst packet can be transmitted. If the end of the signal is indicated (Step 14), system 1 stops (Step 15). Otherwise, the limit registers are reloaded (Step 16), the timers are reset (Step 17). Output latch 63 is switched to the active state and first timer 11 is enabled (Step 18), permitting it to frequency modulate the diodes as described above. The above described sequence is then repeated.

Pulse mode infrared transmission is accomplished with less microprocessor interaction. The reason for this is that a single constant active state width 95 is transmitted in pulse mode. The microprocessor loads limit register one 23 with the required active state width 95 and limit register 47 with idle time 97A. Once the limit registers are loaded, the microprocessor starts both counters 15, 41. When first counter 15 reaches active state width 95 held in limit register 23, transmit output latch 63 is switched to be inactive. At the same time, first timer 11 is disabled from signalling transmit output latch 63.

Transmit output latch 63 stays inactive until second counter 41 reaches idle time 97A stored in limit register 47. At that point a number of events occur. First, first timer 11 is re-enabled. Second, the microprocessor loads limit register 47 with the next idle time 97B. Third, both counters 15, 41 are cleared and restarted.

Frequency shift keying mode requires heavy microprocessor interaction. First frequency period 101A is loaded into limit register one 23 and limit register 25. The active time is held in limit register 23 while the inactive time is held in limit register two 25. The time that first frequency 103 is present is loaded into limit register 47. Compare logic unit 45 is disconnected from transmit control logic unit 61 so that when a limit compare occurs, the infrared wave train is not interrupted. Both counters 15, 41 are then started.

The actual infrared output operates similarly to carrier mode transmission except that second timer 13 cannot turn off the transmit carrier. Instead, when second timer 13 compares a limit value to the count value in counter 41, second counter 13 is reset and the microprocessor is signalled to load a new limit value into limit register 47. The microprocessor must supply the longer second timer limit value as well as the switch frequency. Therefore, the microprocessor must supply both limit registers 23, 25 in first timer 11 with new period information and supply the limit to the length of time the next frequency is output.

The final transmission mode is continuous wave mode. This mode is quite simple. The microprocessor merely has to set up first timer 11 for constant carrier output and turn off second timer 13. The microprocessor supplies the same frequency for as long as the user holds down a key.

The invention as described provides a remote controller which can be programmed and reprogrammed to replace a multiplicity of preprogrammed remote controllers. The invention accomplishes remote control of a multiplicity of devices through the use of a custom designed timer circuit. This timer circuit solves the problems associated with the limited features of prior "built in" microprocessor timers. Further, the timer circuit can be used in any of four transmission modes including carrier mode, pulse mode, frequency shift keying mode, and continuous wave mode.

In general, to those skilled in the art to which this invention relates, many changes in construction and widely differing embodiments and applications of the present invention will suggest themselves without departing from its spirit and scope. Thus, the disclosures and descriptions herein are purely illustrative and are not intended to be in any sense limiting.

What is claimed is:

1. An apparatus for controlling multiple remote control devices capable of transmitting continuous wave mode infrared patterns received from an infrared detector, the continuous wave mode infrared patterns composed of pulses of varying length, interspersed with idle period of varying lengths, each pulse including a rising edge, an active state, and a falling edge, the apparatus comprising;

means for setting a first counter to commence counting;

means for producing an active signal;

means for comparing the count value of said first counter to a preselected active count limit;

means for continuing said first counter counting if said preselected active count limit has not been reached;

means for resetting said first counter if said preselected active count limit has been reached;

means for producing an inactive signal;

means for comparing the count value of said first counter to a preselected inactive count limit;

means for continuing said second counter counting if said preselected inactive count limit has not been reached; and means for resetting said second counter if said preselected inactive count limit has been reached.

2. A system for controlling multiple remote electronic devices capable of learning and later transmitting carrier mode infrared patterns received from an infrared detector, the carrier mode infrared patterns composed of burst packets of pulse interspersed between idle periods, each pulse including a rising edge, an active state, and a falling edge, the system comprising:

a first timer for measuring the width of carrier mode pulses, for issuing a first signal when the width of a carrier mode pulse exceeds a predetermined value and for issuing a second signal when an idle time interval has ended;

a second timer, connected to receive said first signal and said second signal, for measuring a burst time interval beginning with receipt of a first pulse from said infrared detector and continuing until said first signal is received, said second timer being reset upon receipt of said first signal and thereafter measuring an idle time interval ending with a next pulse is received from said infrared detector; and programmable means, connected to said first timer and said second timer, for selecting said predetermined value and for storing said burst and idle time intervals.

3. In a system for controlling multiple remote electronic devices capable of learning carrier mode infrared mode infrared patterns composed of burst packets of pulses interspersed between idle periods, each pulse including a rising edge, an active state, and a falling edge, a method for learning a carrier mode infrared pattern, comprising the steps of:

a. initializing a set of limit registers such that a first limit register contains a first value representing an active state pulse width, and a second limit register contains a second value representing a burst packet time period;

b. waiting for an infrared signal to be received;

c. commencing a first and second timer counting;

d. sensing when rising edges and falling edges are received;

e. resetting said first timer when said rising and falling edges are received;

f. sensing when said first timer exceeds a predetermined pulse width value;

g. storing the count value of said second timer;

h. resetting said second timer;

i. waiting for a next rising edge;

j. sensing when said next rising edge is received;

k. storing the count value of said second timer; and l. repeating steps c–k until the end of the signal is detected.

4. In a system for controlling multiple remote electronic devices capable of transmitting carrier mode infrared patterns, the carrier mode infrared patterns composed of burst packets of pulses interspersed between idle periods, each pulse including a rising edge, an active state, and a falling edge, a method for producing a carrier mode infrared pattern, comprising the steps of:

a. initializing a set of limit registers such that a first limit register contains an active state value, and a second limit register contains a burst packet time value;

b. commencing a first and second timer counting;
c. producing an active signal;
d. continuing to produce an active signal until said first timer has reached the active state value;
e. resetting said first timer;
f. reloading said first limit register with an inactive state value;
g. producing an inactive signal;
h. continuing to producing an inactive signal until said first timer has reached the inactive state value;
i. repeating steps c-g until said second timer has reached the burst packet time value held in said second limit register;
j. disabling said first timer;
k. resetting said second timer
l. reloading said second limit register with a value equal to an idle time period value;
m. producing an inactive signal;
n. continuing to produce an inactive signal until said second timer has reached the idle time period value held in said second limit register; and
o. repeating steps b-n until the entire signal has been transmitted.

5. A system for controlling multiple remote electronic devices, capable of learning carrier mode infrared patterns, received from an infrared detector, the infrared patterns composed of burst packets of pulses interspersed between idle periods, each pulse including a rising edge, an active state, and a falling edge, the system comprising:
a first timer including.
  a first counter;
  a first clock, connected to said first counter for providing clock signals to said first counter;
  a first capture register unit connected to said first counter and the infrared detector for receiving and capturing pulse widths of the frequency of the infrared patterns from the infrared detector;
  a first limit register set to a preselected value for providing a first limit register output signal;
  first compare logic means connected to said first limit register and said first counter for comparing the output of said first counter to said preselected value; and
  first reset control means, connected to said first capture register unit and said first counter, for resetting said first counter after a full frequency cycle has been captured by said first capture register unit; and
a second timer including,
  a second counter;
  a second clock connected to said second counter for providing clock signals to said second counter;
  a second capture register unit, connected to said second counter, for measuring an idle time between infrared cycles detected by said first capture register unit;
  capture register steering means, connected to said first compare logic means, said first capture register unit, and said second capture register unit, for selecting the source of input to said second capture register unit to be said first compare logic means when said first counter has exceeded said preselected value and to be said first capture register unit once a rising edge of a pulse is received by said first capture register unit after said first counter has exceeded said preselected value; and
second reset control means, connected to said capture register steering means and said second counter for resetting said second counter after a full frequency cycle has been captured by said second capture register unit.

6. In a system for controlling multiple remote electronic devices, capable of learning carrier mode infrared patterns received from an infrared detector, the carrier mode infrared patterns composed of burst packets of pulses interspersed between idle periods, each pulse including a rising edge, an active state, and a falling edge, a method for learning an incoming carrier mode infrared pattern comprising the steps of:
a. sensing when a first rising edge of a pulse has been received;
b. measuring a first length of each received pulse and a first duration of the intervals between each received pulse;
c. commencing measurement of a second length with receipt of said rising edge;
d. sensing when said second length exceeds a preselected fixed length value representing a carrier mode burst packet time;
e. recording a first time interval between a first time when said first rising edge was received and a second time at which a duration interval exceeds said preselected fixed length value; and
f. recording a second time interval between said second time and a third time when a next rising edge is received after said second time.

7. An apparatus for controlling multiple remote electronic devices, capable of learning carrier mode infrared patterns received from an infrared detector, the carrier mode infrared patterns composed of burst packets of pulses interspersed between idle periods, each pulse including a rising edge, an active state, and a falling edge, the apparatus comprising:
means for sensing when a first rising edge of a pulse has been received;
means for measuring a first length of each received pulse and a first duration of the intervals between each received pulse;
means adapted to receive a value sensing the length of each received pulse added to the duration of the intervals between each received pulse for comparing a second length measured from receipt of said first rising edge to a preselected fixed length value representing a carrier mode burst packet time;
means for sensing when said second length exceeds said preselected fixed length value;
means for recording a first time interval between a first time when said first rising edge was received and a second time at which a duration interval exceeds said preselected fixed length value; and
means for recording a second time interval between said second time and a third time when a next rising edge is received after said second time.

8. A system for controlling multiple remote electronic devices, capable of transmitting carrier mode infrared patterns received from an infrared detector, the infrared patterns composed of a series of pulses of varying widths interspersed between idle periods of varying widths, each pulse including a rising edge, an active state, and a falling edge, the system comprising:
a first timer including.
  a first counter;

a first clock, connected to counter for providing clock signals to said first counter;

a first limit register set to a first preselected value for providing a first limit register output;

a second limit register set to a second preselected value for providing a second limit register output;

a limit register selection unit for providing a limit output selected from said first limit register output and said second limit register output;

first compare logic means connected to said limit register selection unit and said first counter for comparing the output of said first counter to said limit output;

a second timer including.
  a second counter;
  a second clock connected to said second counter for providing clock signals to said second counter;
  a third limit register set to a third preselected value for providing a third limit register output;
  second compare logic means connected to said third limit register and said second counter for comparing the output of said second counter to said third limit register output;

a transmit control logic unit connected to said first compare logic means and said second compare logic means for selecting between the outputs of said first compare logic means and said second compare logic means; and a transmit output latch for latching the infrared signal to be output and toggling the value of the infrared signal each time said first compare logic means makes a compare resulting in the value in one of said counters exceeding the value in its corresponding limit register.

9. In a system for controlling multiple remote electronic devices, capable of transmitting carrier mode infrared patterns received from an infrared detector, the carrier mode infrared patterns composed of burst packets of pulses interspersed between idle periods, each pulse including a rising edge, an active state, and a falling edge, a method for producing carrier mode infrared patterns comprising the steps of:

a. setting a first counter and a second counter to commence counting;
b. producing an active signal;
c. comparing the count value of said first counter to a preselected active count limit representing the length of the active state of a pulse;
d. continuing said first counter counting if said preselected active count limit has not been reached;
e. resetting said first counter to commence counting if said preselected active count limit has been reached;
f. producing an inactive signal;
g. comparing the count value of said first counter to a preselected inactive count limit representing the length of the inactive state between pulses;
h. continuing said first counter counting if said preselected inactive count limit has not been reached;
i. resetting said first counter to commence counting if said preselected inactive count limit has been reached;
j. repeating steps (a) through (i) until said second counter exceeds a preselected burst packet time;
k. producing an inactive signal;
l. disabling said first counter;
m. resetting said second counter to count to a preselected idle time count representing the idle period between burst packets;
n. comparing the count value of said second counter to said preselected idle time count;
o. continuing said second counter counting if said preselected idle time count has not been reached;
p. enabling said first counter if said preselected idle time count has been reached; and
q. repeating steps (a) through (p) until the infrared signal is complete.

10. An apparatus for controlling multiple remote electronic devices, capable of transmitting carrier mode infrared patterns received from an infrared detector, the infrared patterns composed of burst packets of pulses interspersed between idle periods, each pulse including a rising edge, an active state, and a falling edge, the apparatus comprising:

means for setting a first counter and a second counter to commence counting;
means for producing an active signal;
means for comparing the count value of said first counter to a preselected active count limit;
means for continuing said first counter counting if said preselected active count limit has not been reached;
means for resetting said first counter to commence counting if said preselected active count limit has been reached;
means for producing an inactive signal;
means for comparing the count value of said first counter to a preselected inactive count limit representing the length of the inactive state;
means for continuing said first counter counting if said preselected inactive count limit has not been reached;
means for resetting said first counter to commence counting if said preselected inactive count limit has been reached;
means for producing an inactive signal;
means for disabling said first counter;
means for resetting said second counter to count to a preselected idle time count representing the idle period between burst packets;
means for comparing the count value of said second counter to said preselected idle time count;
means for continuing said second counter counting if said preselected idle time count has not been reached; and
means for enabling said first counter if said preselected idle time count has been reached.

11. A system for controlling multiple remote electronic devices, capable of learning and replaying infrared patterns received from an infrared detector, the infrared patterns composed of a series of pulses of varying widths interspersed between idle periods of varying widths each pulse including a rising edge, an active state, and a falling edge, the system comprising:
  a first timer including,
    a first counter;
    a first clock, connected to said first counter for providing clock signals to said first counter;
    a first capture register unit connected to said first counter and the infrared detector for receiving and capturing pulse widths of the frequency of the infrared patterns from the infrared detector;
    a first limit register capable of being set to a first preselected value indicating a first predetermined pulse width for providing a first limit register output signal;

a second limit register capable of being set to a second preselected value for providing a second limit register output signal;

a limit register selection unit for providing a limit output selected from said first limit register output signal and said second limit register output signal;

first compare logic means connected to said limit register selection unit and said first counter for comparing the output of said first counter to one of said preselected values; and first reset control means, connected to said first capture register unit and said first counter, for resetting said first counter after a full frequency cycle has been captured by said first capture register unit;

a second timer including,
  a second counter;
  a second lock connected to said second counter for providing clock signals to said second counter;
  a second capture register unit, connected to said second counter, for measuring a burst packet line and an idle time between burst packets detected by said first capture register unit;
  a third limit register capable of being set to a third preselected value for providing a third limit register output signal;
  a capture register steering means, connected to said first compare logic means, said first capture register unit, and said second capture register unit for selecting the source of input to said second capture register unit to be said first compare logic means when said first counter has exceeded one of said preselected values and to be said first capture register unit once a rising edge of a pulse is received by said first capture register unit after said first counter has exceeded one of said preselected values;
  second compare logic means connected to said third limit register and said second counter for comparing the output of said second counter to said third preselected value; and
  second reset control means, connected to said capture register steering means, said second counter, and said second compare logic unit for resetting said second counter after a full frequency cycle has been captured by said second capture register unit;
  a transmit control logic unit connected to said first compare logic means and said second compare logic means for selecting between the outputs of said first compare logic means and said second compare logic means; and
  a transmit output latch for latching the infrared signal to be output and toggling the value of the infrared signal each time said first compare logic means makes a compare resulting in the value in one of said counters exceeding the value in its corresponding limit register.

12. A system for controlling multiple remote electronic devices, capable of learning pulse mode infrared patterns, the pulse mode infrared patterns composed of pulses interspersed between idle periods of varying lengths, each pulse including a rising edge, an active state, and a falling edge, the system comprising:
a first timer including,
  a first counter;
  a first clock, connected to said first counter for providing clock signals to said first counter;
  a first capture register unit connected to said first counter and the infrared detector for receiving and capturing pulse widths of the frequency of the infrared patterns from the infrared detector;
  first reset control means, connected to said first capture register unit and said first counter, for resetting said first counter after a full frequency cycle has been captured by said first capture register unit; and
a second timer including.
  a second counter;
  a second clock connected to said second counter for providing clock signals to said second counter;
  a second capture register unit, connected to said second counter and said first capture register unit, for measuring an idle time between infrared cycles detected by said first capture register unit; and
  second reset control means, connected to said first capture register unit and said second counter for resetting said second counter after a full frequency cycle has been captured by said second capture register unit.

13. In an apparatus for controlling multiple remote devices, capable of transmitting frequency shift key mode infrared patterns received from an infrared detector, the frequency shift key mode infrared patterns composed of a series of pulses of varying frequencies, each pulse including a rising edge, an active state, and a falling edge, a method for learning a frequency shift key mode infrared pattern comprising the steps of:
  a. sensing when a rising edge of a pulse has been received;
  b. measuring a first length of time until a falling edge of a pulse has been received;
  c. sensing when a next rising edge of a pulse has been received;
  d. measuring a second length of time until a next falling edge of a pulse has been received;
  e. comparing said second length to said first length; and
  f. sensing when said second length is substantially different from said first length.

14. An apparatus for controlling multiple remote devices, capable of learning frequency shift key mode infrared patterns, the frequency shift key mode infrared patterns composed of a series of pulses of varying frequencies, each pulse including a rising edge, an active state, and a falling edge, the apparatus comprising:
  means for sensing when a rising edge of a pulse has been received;
  means for measuring a first length of time until a falling edge of a pulse has been received;
  means for sensing when a next rising edge of a pulse has been received;
  means for measuring a second length of time until a next falling edge of a pulse has been received;
  means for comparing said second length to said first length; and
  means for sensing when said second length is substantially different from said first length.

15. A system for controlling multiple remote control devices capable of learning continuous wave mode infrared patterns, the continuous wave mode infrared patterns composed of pulses of varying lengths, interspersed with idle periods of varying lengths, each pulse including a rising edge, an active state, and a falling edge, the system comprising;
- a counter;
- a clock, connected to said counter for providing clock signals to said counter;
- a capture register unit connected to said counter and the infrared detector for receiving and capturing pulse widths of the frequency of the infrared patterns from the infrared detector;
- a limit register set to a preselected value for providing a limit register output signal;
- compare logic means connected to said limit register and said counter for comparing the output of said counter to said preselected value; and
- reset control means, connected to said capture register unit and said counter, for resetting said counter after a full frequency cycle has been captured by said capture register unit.

16. An apparatus for controlling multiple remote electronic devices, capable of transmitting pulse mode infrared patterns received from an infrared detector, the pulse mode infrared patterns composed of pulses interspersed between idle periods of varying lengths, each pulse including a rising edge, an active state, and a falling edge, the apparatus comprising:
- a first timer including.
  - a first counter;
  - a first clock, connected to said first counter for providing clock signals to said first counter;
  - a first limit register set to a first preselected value for providing a first limit register output;
  - first compare logic means connected to said first limit register unit and said first counter for comparing the output of said first counter to the output of said first limit register;
- a second timer including.
  - a second counter;
  - a second clock connected to said second counter for providing clock signals to said second counter;
  - a second limit register set to a second preselected value for providing a second limit register output;
  - second compare logic means connected to said second limit register and said second counter for comparing the output of said second counter to said second limit register output;
- a transmit control logic unit connected to said first compare logic means and said second compare logic means for selecting between the outputs of said first compare logic means and said second compare logic means; and
- a transmit output latch for latching the infrared signal to be output and toggling the value of the infrared signal each time said first compare logic means makes a compare resulting in the value in one of said counters exceeding the value in its corresponding limit register.

17. In a system for controlling multiple remote electronic devices, capable of transmitting pulse mode infrared patterns received from an infrared detector, the pulse mode infrared patterns composed of pulses interspersed between idle periods of varying lengths, each pulse including a rising edge, an active state, and a falling edge, a method for producing pulse mode infrared patterns comprising the steps of;

a. setting a first counter and a second counter to commence counting;
b. producing an active signal;
c. comparing the count value of said first counter to a preselected active count limit representing the pulse width of pulse mode pulses;
d. continuing said first counter counting if said preselected active count limit has not been reached;
e. resetting said first counter if said preselected active count limit has been reached;
f. disabling said first counter;
g. producing an inactive signal;
h. comparing the count value of said second counter to a preselected inactive count limit representing the length of the inactive state between pulses;
i. continuing said second counter counting if said preselected inactive count limit has not been reached;
j. resetting said second counter if said preselected inactive count limit has been reached;
k. enabling said first counter; and
l. repeating steps (a) through (k) until the entire infrared signal has been sent.

18. An apparatus for controlling multiple remote electronic devices, capable of transmitting pulse mode infrared patterns received from an infrared detector, the pulse mode infrared patterns composed of pulses interspersed between idle periods of varying lengths, each pulse including a rising edge, an active state, and a falling edge, the apparatus comprising:
- means for setting a first counter and a second counter to commence counting;
- means for producing an active signal;
- means for comparing the count value of said first counter to a preselected active count limit representing the pulse width of pulse mode pulses;
- means for continuing said first counter counting if said preselected active count limit has not been reached;
- means for resetting said first counter if said preselected active count limit has been reached;
- means for disabling said first counter;
- means for producing an inactive signal;
- means for comparing the count value of said second counter to a preselected inactive count limit representing the length of the inactive state between pulses;
- means for continuing said second counter counting if said preselected inactive count limit has not been reached;
- means for resetting said second counter if said preselected inactive count limit has been reached; and
- means for enabling said first counter.

19. In an apparatus for controlling multiple remote devices, capable of transmitting frequency shift key mode infrared patterns received from an infrared detector, the frequency shift key mode infrared patterns composed of a series of pulses of varying frequencies, each pulse including a rising edge, an active state, and a falling edge, a method for producing a frequency shift key mode infrared pattern comprising the steps of:
a. setting a first counter and a second counter to commence counting;
b. producing an active signal;
c. comparing the count value of said first counter to a preselected count limit representing the width of a first frequency FSK pulse;

d. continuing said first counter counting if said preselected count limit has not been reached;

e. resetting said first counter if said preselected count limit has been reached;

f. comparing the count value of said second counter to a preselected frequency period limit representing the time for transmitting pulses in said first frequency;

g. continuing said second counter counting if said preselected frequency period limit has not been reached;

h. producing on alternative times through the sequence of steps an inactive signal and an active signal;

i. repeating steps (c) through (h) for said inactive signal;

j. resetting said first counter and said second counter if said preselected frequency period limit has been reached; and k. repeating steps (c) through (j) until the infrared signal has been completely sent.

20. An apparatus for controlling multiple remote devices, capable of transmitting frequency shift key mode infrared patterns received from an infrared detector, the frequency shift key mode infrared patterns composed of a series of pulses of varying frequencies, each pulse including a rising edge, an active state, and a falling edge, the apparatus comprising;

means for setting a first counter and a second counter to commence counting;

means for producing an active signal;

means for comparing the count value of said first counter to a preselected count limit representing the width of a first frequency FSK pulse;

means for continuing said first counter counting if said preselected count limit has not been reached;

means for resetting said first counter if said preselected count limit has been reached;

means for comparing the count value of said second counter to a preselected frequency period limit representing the time for transmitting pulses in said first frequency;

means for continuing said second counter counting if said preselected frequency period limit has not been reached;

means for producing on alternative times through the sequence of steps an inactive signal and an active signal; and means for resetting said first counter and said second counter if said preselected frequency period limit has been reached.

21. An apparatus for controlling multiple remote control devices capable of transmitting continuous wave mode infrared patterns received from an infrared detector, the continuous wave mode infrared patterns composed of pulses of varying lengths, interspersed with idle periods of varying lengths, each pulse including a rising edge, an active state, and a falling edge, comprising:

a first timer including.
  a first counter;
  a first clock, connected to said first counter for providing clock signals to said first counter;
  a first limit register set to a first preselected value for providing a first limit register output;
  first compare logic means connected to said first limit register and said first counter for comparing the output of said first counter to the output of said first limit register; and
a transmit output latch for latching the infrared signal to be output and toggling the value of the infrared signal each time said first compare logic means makes a compare resulting in the value in said first counter exceeding the value in said first limit register.

22. In an apparatus for controlling multiple remote control devices capable of transmitting continuous wave mode infrared patterns received from an infrared detector, the continuous wave mode infrared patterns composed of pulses of varying lengths, interspersed with idle period of varying lengths, each pulse including a rising edge, an active state, and a falling edge, a method for producing continuous wave infrared patterns comprising the steps of:

a. setting a first counter to commence counting;

b. producing an active signal;

c. comparing the count value of said first counter to a preselected active count limit representing the length of an active signal;

d. continuing said first counter counting if said preslected active count limit has not been reached;

e. resetting said first counter if said preselected active count limit has been reached;

f. producing an inactive signal;

g. comparing the count value of said first counter to a preselected inactive count limit representing the length of an inactive signal;

h. continuing said second counter counting if said preselected inactive count limit has been reached;

i. resetting said second counter if said preselected inactive count limit has been reached; and j. repeating steps (a) through (i) until the entire infrared signal has been sent.

* * * * *